(12) United States Patent
Hayashi et al.

(10) Patent No.: US 11,048,092 B2
(45) Date of Patent: Jun. 29, 2021

(54) DISPLAY DEVICE AND HEAD-MOUNTED DISPLAY

(71) Applicants: Sharp Kabushiki Kaisha, Sakai (JP); Nichia Corporation, Anan (JP)

(72) Inventors: Tokumi Hayashi, Sakai (JP); Kenichi Hatsuda, Sakai (JP); Seitaro Akagawa, Komatsushima (JP); Takeshi Morikawa, Tokushima (JP)

(73) Assignees: SHARP KABUSHIKI KAISHA, Sakai (JP); NICHIA CORPORATION, Tokushima (JP)

( * ) Notice: Subject to any disclaimer, the term of this patent is extended or adjusted under 35 U.S.C. 154(b) by 0 days.

(21) Appl. No.: 16/988,753

(22) Filed: Aug. 10, 2020

(65) Prior Publication Data

US 2021/0096374 A1    Apr. 1, 2021

Related U.S. Application Data

(63) Continuation of application No. 16/497,813, filed as application No. PCT/JP2018/013647 on Mar. 30, 2018, now Pat. No. 10,775,627.

(30) Foreign Application Priority Data

Mar. 30, 2017 (JP) .................. 2017-067299

(51) Int. Cl.
| | |
|---|---|
| *H01L 33/50* | (2010.01) |
| *G02B 27/01* | (2006.01) |
| *G02F 1/13357* | (2006.01) |
| *G02F 1/1335* | (2006.01) |

(52) U.S. Cl.
CPC ....... *G02B 27/0172* (2013.01); *G02F 1/1336* (2013.01); *G02F 1/133614* (2021.01)

(58) Field of Classification Search
CPC ....... H01L 33/50; H01L 33/56; H01L 25/075; C09K 11/77; H05B 33/12; G02F 1/00
See application file for complete search history.

(56) References Cited

U.S. PATENT DOCUMENTS

2013/0264937 A1* 10/2013 Sakuta .................. H01L 33/504
                                                                    313/503

OTHER PUBLICATIONS

Hayashi et al., "Display Device and Head-Mounted Display", U.S. Appl. No. 16/497,813, filed Sep. 26, 2019.

* cited by examiner

*Primary Examiner* — Michael A Faragalla
(74) *Attorney, Agent, or Firm* — Keating & Bennett, LLP

(57) ABSTRACT

A head-mounted display to be mounted on a head of the user includes a display panel to display an image, a lighting device to supply light to the display device, the lighting device including at least one light source including a blue light emitting element emitting blue light, and a red phosphor to emit red light when excited by the blue light from the blue light emitting element, the red phosphor including a complex fluoride red phosphor and a nitride red phosphor having a content ratio smaller than that of the complex fluoride red phosphor, a lighting controller to control driving of the light source in synchronization with the image display by the display device so that a one-frame display period in the display device includes a turn-on period and a turn-off period, and a lens.

17 Claims, 11 Drawing Sheets

FIG.8

| | | COMPARATIVE EXAMPLE 1 | COMPARATIVE EXAMPLE 2 | EXAMPLE 1 | EXAMPLE 2 | EXAMPLE 3 |
|---|---|---|---|---|---|---|
| CONTENT RATIO (%) | KSF PHOSPHOR | 100 | 90 | 85 | 75 | 50 |
| | CASN PHOSPHOR | 0 | 10 | 15 | 25 | 50 |
| RELATIVE BRIGHTNESS LEVEL (%) | | 100 | 96.5 | 95.5 | 93.4 | 88.7 |
| RELATIVE NTSC RATIO (%) | | 100 | 96.4 | 95.4 | 94.6 | 93.5 |

FIG.9

| | | COMPARATIVE EXAMPLE 1 | COMPARATIVE EXAMPLE 2 | EXAMPLE 1 | EXAMPLE 2 | EXAMPLE 3 |
|---|---|---|---|---|---|---|
| CONTENT RATIO (%) | KSF PHOSPHOR | 100 | 90 | 85 | 75 | 50 |
| | CASN PHOSPHOR | 0 | 10 | 15 | 25 | 50 |
| EVALUATION | | — | × | △ | ○ | ○ |

DISPLAY DEVICE AND HEAD-MOUNTED DISPLAY

TECHNICAL FIELD

The present invention relates to a display device and a head-mounted display.

BACKGROUND ART

Conventionally, a liquid crystal display device described in Patent Document 1 below has been known as an example of a liquid crystal display device. The liquid crystal display device described in Patent Document 1 includes a control circuit that includes alight source controller configured to output a light emission control signal to each light source power supply circuit in synchronization with a latch pulse signal that is outputted from a gate driver controller to a gate driver. Each light source power supply circuit switches the light emission state of a cold-cathode tube to any of first to third light emission states in accordance with a light emission control signal inputted thereto and illuminates an LCD panel with light from behind a display region. The first stage of light emission state is a turn-off state. The second stage of light emission state is a maximum illuminating state in which a maximum brightness level can be achieved. The third light emission state is an intermediate illuminating state that gives nearly half of the brightness level of the second stage of light emission state.

RELATED ART DOCUMENT

Patent Document
Patent Document 1: Japanese Unexamined Patent Application Publication No. 2004-206044

Problem to be Solved by the Invention

A liquid crystal display device such as the one described in Patent Document 1 is configured such that the afterglow of a green phosphor contained in the cold-cathode tube is canceled out by the light source controller driving the cold-cathode tube with a large current, greatly reducing the current immediately after, and then smoothly increasing the current. However, the light source is changed to an LED and the phosphor is changed to a different type of phosphor, the afterglow of the phosphor may not to be canceled out by a duty driving method such as the one described above, and the phosphor may emit light with insufficient color reproducibility and brightness level.

DISCLOSURE OF THE PRESENT INVENTION

The present invention was made in view of the above circumstances. Preferred embodiments of the present invention are able to achieve sufficient color reproducibility and brightness level for red light and to reduce afterglows of the red light.

Means for Solving the Problem

A display device of a preferred embodiment of the present invention includes a display panel to display an image, a lighting device to supply light to the display device, the lighting device including at least one light source including at least a blue light emitting element emitting blue light, and a red phosphor to emit red light when excited by the blue light from the blue light emitting element, the red phosphor including a complex fluoride red phosphor and a nitride red phosphor having a content ratio smaller than a content ratio of the complex fluoride red phosphor, a lighting controller to control driving of the at least one light source in synchronization with the image display by the display device so that a one-frame display period in the display device includes a turn-on period and a turn-off period, and a lens through which an image of the image displayed on the display device is formed in an eye of a user.

According to the configuration, the light is supplied to the display panel the lighting device that includes the light source, the driving of which is controlled by the lighting controller. The image is displayed on the display panel using the. The light source of the lighting device includes at least the blue light emitting element that emits blue light and a red phosphor that emits red light when excited by the blue light from the blue light emitting element. The red phosphor contains a complex fluoride red phosphor. Therefore, higher color reproducibility and brightness level can be achieved for the red light.

The lighting controller controls the driving of the light source in synchronization with the image display by the display panel. In particular, the lighting controller controls the driving of the light source so that a one-frame display period in the display panel includes a turn-on period and a turn-off period. According to the configuration, an image lag is less likely to be recognized by the user during moving image display on the display panel, that is, higher moving image display performance can be achieved. Even if the lighting controller causes the light source to shift from a turn-on state to a turn-off state, the complex fluoride phosphor of the red phosphor of the light source has a property of continuing to emit red light for a predetermined period of time even after disruption of the supply of the blue light as exciting light from the blue light emitting element and therefore raises concern that the red light may be visually recognized as an afterglow. In contrast, since the red phosphor contains the nitride red phosphor in addition to the complex fluoride red phosphor, higher color reproducibility and brightness level can be achieved for the red light and the red light is less likely to be recognized as an afterglow. Specifically, in a configuration in which the content ratio of the complex fluoride red phosphor is 50% or higher and a case where the content ratio of the nitride red phosphor is 50% or lower, the color reproducibility and the brightness level of the red light can be maintained sufficiently higher than if the content ratio of the complex fluoride red phosphor is lower than 50% and the content ratio of the nitride red phosphor is higher than 50%. Furthermore, in a configuration in which the content ratio of the complex fluoride red phosphor is 85% or lower and a configuration in which the content ratio of the nitride red phosphor is 15% or higher, the afterglow of the red light is less likely to be recognized in comparison to a configuration in which the content ratio of the complex fluoride red phosphor is higher than 85% and the content ratio of the nitride red phosphor is lower than 15%.

The content ratio of the complex fluoride red phosphor is preferably in a range from 75% to 85% inclusive. The content ratio of the nitride red phosphor is in a range from 15% to 25% inclusive. In comparison to a configuration in which the content ratio of the complex fluoride red phosphor is 75% or higher and a configuration in which the content ratio of the nitride red phosphor is 25% or lower, the color reproducibility and the brightness level of the red light can be maintained sufficiently higher when the content ratio of the complex fluoride red phosphor is lower than 75% and the content ratio of the nitride red phosphor is higher than 25%. Furthermore, in the configuration in which the content ratio of the complex fluoride red phosphor is 85% or lower and the configuration in which the content ratio of the nitride red phosphor is 15% or higher, the afterglow of the red light is less likely to be recognized in comparison to a configuration in which the content ratio of the complex fluoride red phosphor is higher than 85% and the content ratio of the nitride red phosphor is lower than 15%.

The content ratio of the complex fluoride red phosphor is preferably 85% and the content ratio of the nitride red phosphor is 15%. According to the configuration, significantly higher color reproducibility and the brightness level can be achieved for the red light and thus a possibility of the afterglow of the red light to be recognized is sufficiently reduced.

The content ratio of the complex fluoride red phosphor is preferably 75% and the content ratio of the nitride red phosphor is 25%. According to the configuration, the afterglow of the red light is further less likely to be recognized.

The complex fluoride red phosphor is preferably a fluoride complex red phosphor with manganese used as an activator. This configuration is preferable for maintaining the color reproducibility and the brightness level of the red light higher.

The nitride red phosphor is preferably an alkaline-earth silicon nitride red phosphor with europium used as an activator. This suitably makes it hard to visually recognize the afterglow of the red light.

The lighting controller is preferably configured to control the driving of the at least one light source so that the turn-off period starts in synchronization with the start of the one-frame display period and the turn-on period starts after the end of the turn-off period and ends in synchronization with the end of the one-frame display period. According to the configuration, the driving of the at least one light source by the lighting controller is impulse-type driving. Therefore, an image lag is less likely to be recognized by the user during moving image display on the display panel, that is, higher moving image display performance can be achieved.

The display device preferably further includes a panel controller configured to control the driving of the display panel. The display panel includes pixels arranged in rows and columns. The panel controller is configured to sequentially scan lines of the pixels along a column direction during the one-frame display period. Each of the lines of the pixels includes the pixels arranged in a row direction. The at least one light source includes light sources configured to selectively supply light to the lines of the pixels. The lighting controller is configured to control the driving of the light sources in synchronization with the driving of the lines of pixels to which light is supplied so that the turn-on period and the turn-off period are included in a period in which the lines of pixels are being driven during scanning of the pixels in sequence by the panel controller. According to the configuration, the backlight controller controls the driving of the light sources in synchronization with the scanning of the lines of the pixels by the panel controller and thus an image lag is further less likely to be recognized by the user during moving image display on the display panel, that is, higher moving image display performance can be achieved.

The configuration of preferred embodiments of the present invention is preferable for displaying images following the user's motion without a delay. Higher display quality can be achieved and the user is less likely to feel discomfort known as "VR sickness."

Advantageous Effect of the Invention

According to the present invention, sufficient color reproducibility and brightness level can be achieved for red light and afterglows of the red light can be reduced.

BRIEF DESCRIPTION OF THE DRAWINGS

FIG. 8 is a table illustrating relative brightness levels and relative NTSC ratios of red phosphors according to Comparative Examples 1 and 2 and Examples 1 to 3 of Comparative Experiment 1.

FIG. 9 is a table illustrating results of evaluation of the afterglows of red phosphors according to Comparative Examples 1 and 2 and Examples 1 to 3 of Comparative Experiment 2.

MODES FOR CARRYING OUT THE INVENTION

First Embodiment

A first embodiment of the present invention is described with reference to FIGS. 1 to 9. The present embodiment illustrates a goggle-type head-mounted display (HMD: head-mounted display) HMD and a liquid crystal display device (a display device) 10 that is used in the goggle-type head mounted display HMD. It should be noted that some of the drawings show an X axis, a Y axis, and a Z axis and are drawn so that the direction of each axis is an identical direction in each drawing.

Figure 1:
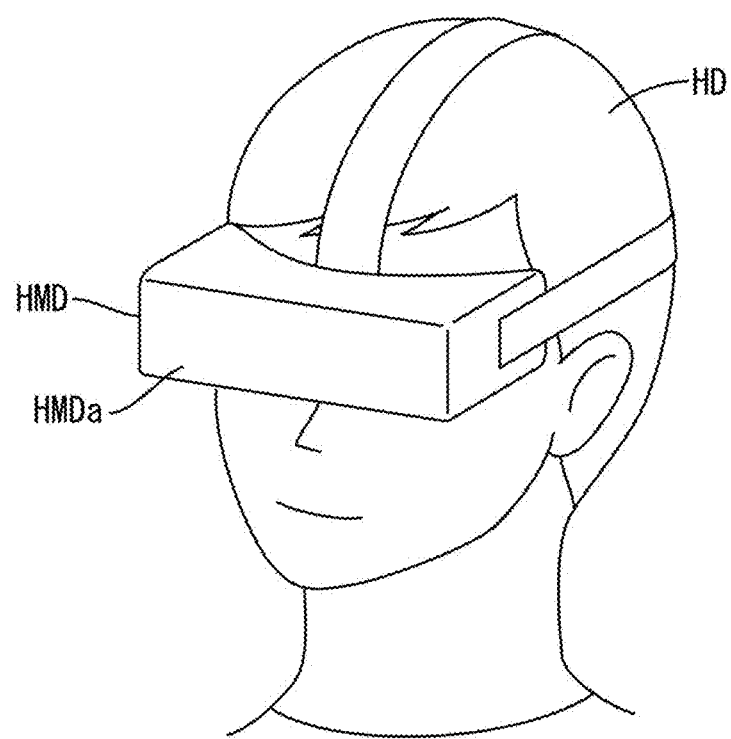
FIG. 1 is a schematic perspective view illustrating a head-mounted display according to a first embodiment of the present invention mounted on a head of a user.
Figure 2:
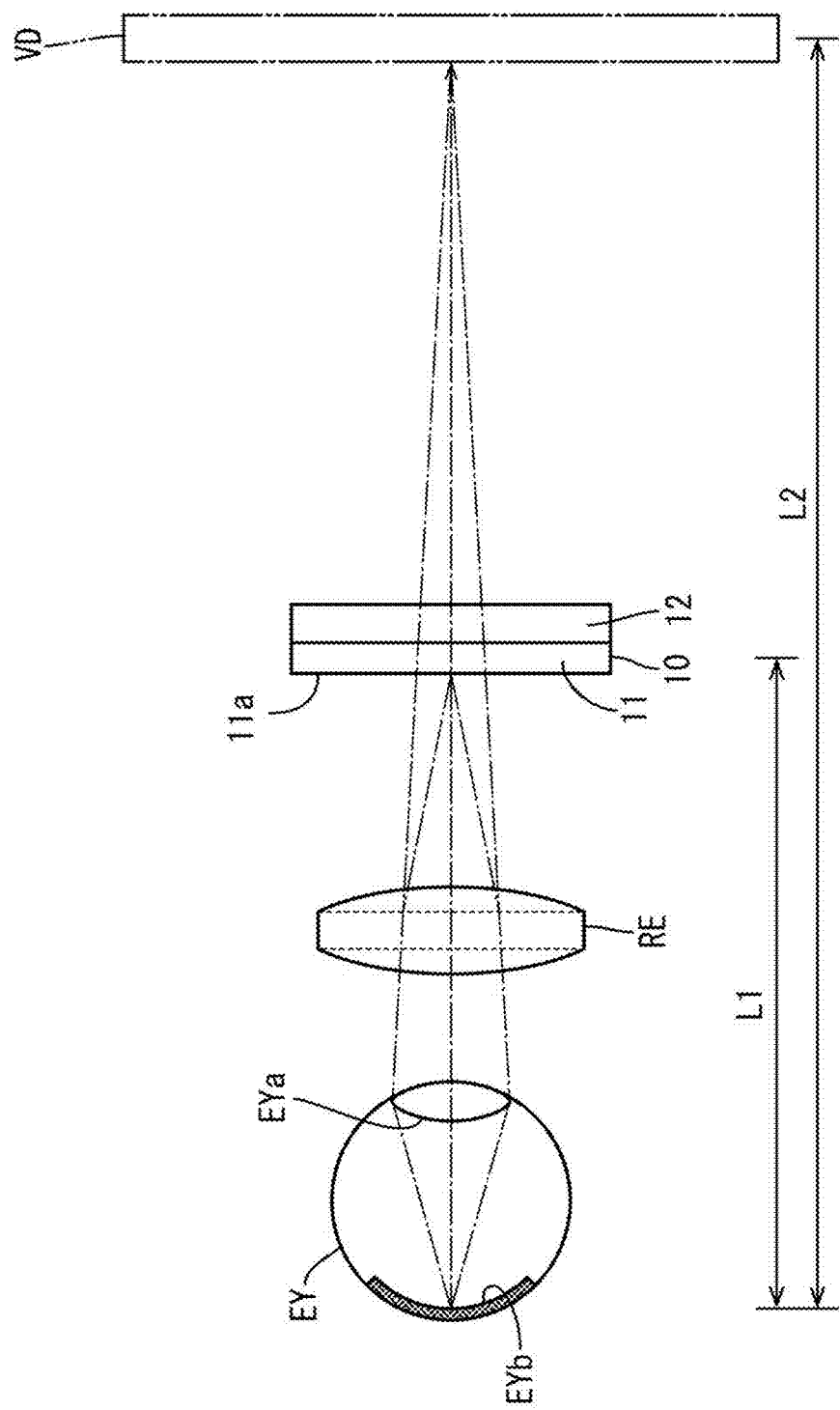
FIG. 2 is a schematic side view illustrating an optical relationship between a liquid crystal display device included in a head mounter of the head-mounted display, a lens of the head mounter, and an eyeball of the user.

As illustrated in FIG. 1, the goggle-type head-mounted display HMD includes a head mounter HMDa that is worn on a head HD of a user in such a manner as to enclose both eyes of the user. As illustrated in FIG. 2, the head mounter HMDa contains at least the liquid crystal display device 10, which displays an image, and a lens (eye lens) RE that causes an image displayed on the liquid crystal display device 10 to be formed on an eyeball (eye) EY of the user. The liquid crystal display device 10, which will be described in detail later, includes at least a liquid crystal panel (display panel) 11 and a backlight device (a lighting device) 12 that illuminates the liquid crystal panel 11 with light. The lens RE is interposed between the liquid crystal display device 10 and the eyeball EY and gives a refractive effect to transmitted light. Adjusting the focal length of this lens RE can make it seem to the user as if an image formed on a retina (eye) EYb via a crystalline lens EYa of the eyeball EY were displayed on a virtual display VD apparently present in a position at a distance L2 much longer than an actual distance L1 from the eyeball EY to the liquid crystal display device 10. This allows the user to visually recognize an enlarged image (virtual image) displayed on the virtual display VD, which has a screen size (e.g. several tens of inches to several hundreds of inches) that is much larger than the screen size (e.g. several tenths of an inch to several inches) of the liquid crystal display device 10. While it is possible to mount the head mounter HMDa with one liquid crystal display device 10 and cause the liquid crystal display device 10 to display a right-eye image and a left-eye image, it is also possible to mount the head mounter HMDa with two liquid crystal display devices 10, cause one of the liquid crystal display devices 10 to display a right-eye image, and cause the other liquid crystal display device 10 to display a left-eye image. It should be noted that the heat mounter HMDa is also equipped, for example, with an earphone (not illustrated) that is put in or over the ears of the user and emits sound.

Figure 3:
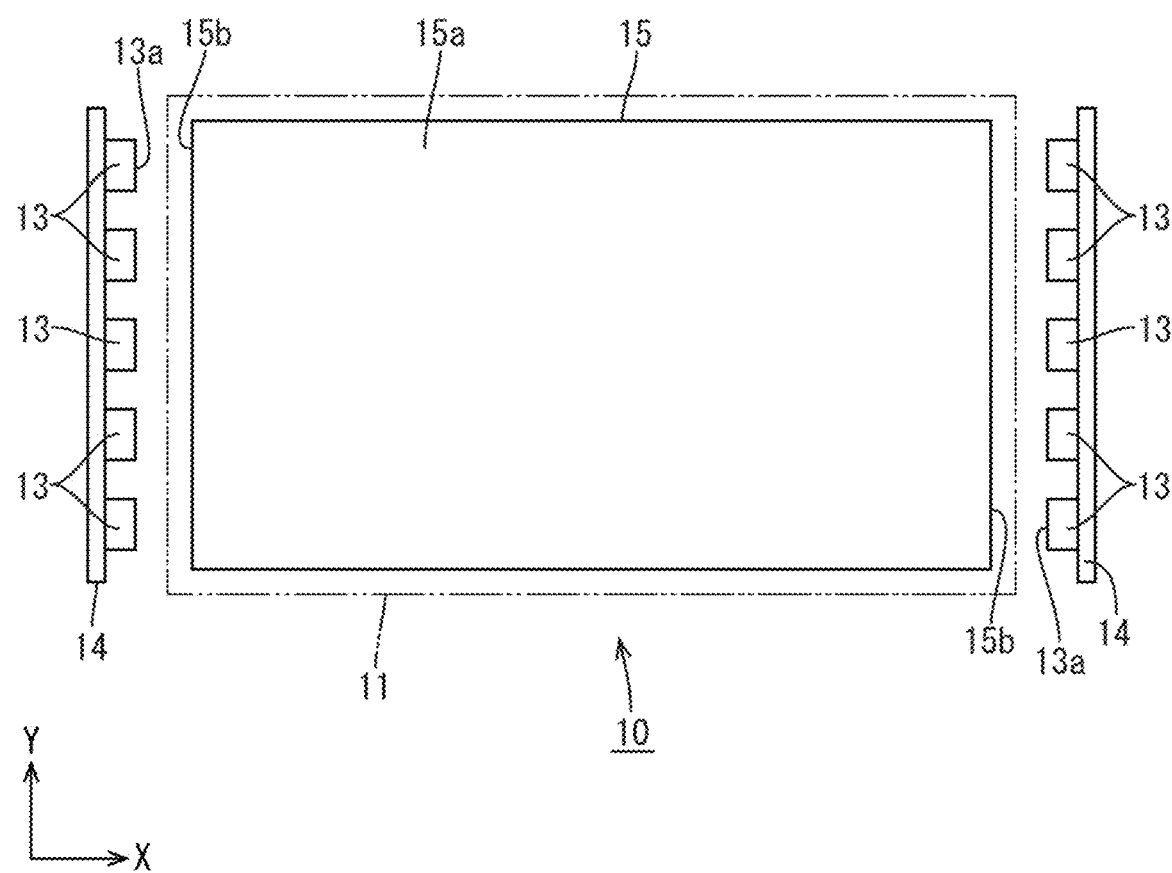
FIG. 3 is a plan view of a backlight device included in the liquid crystal display device.
Figure 4:
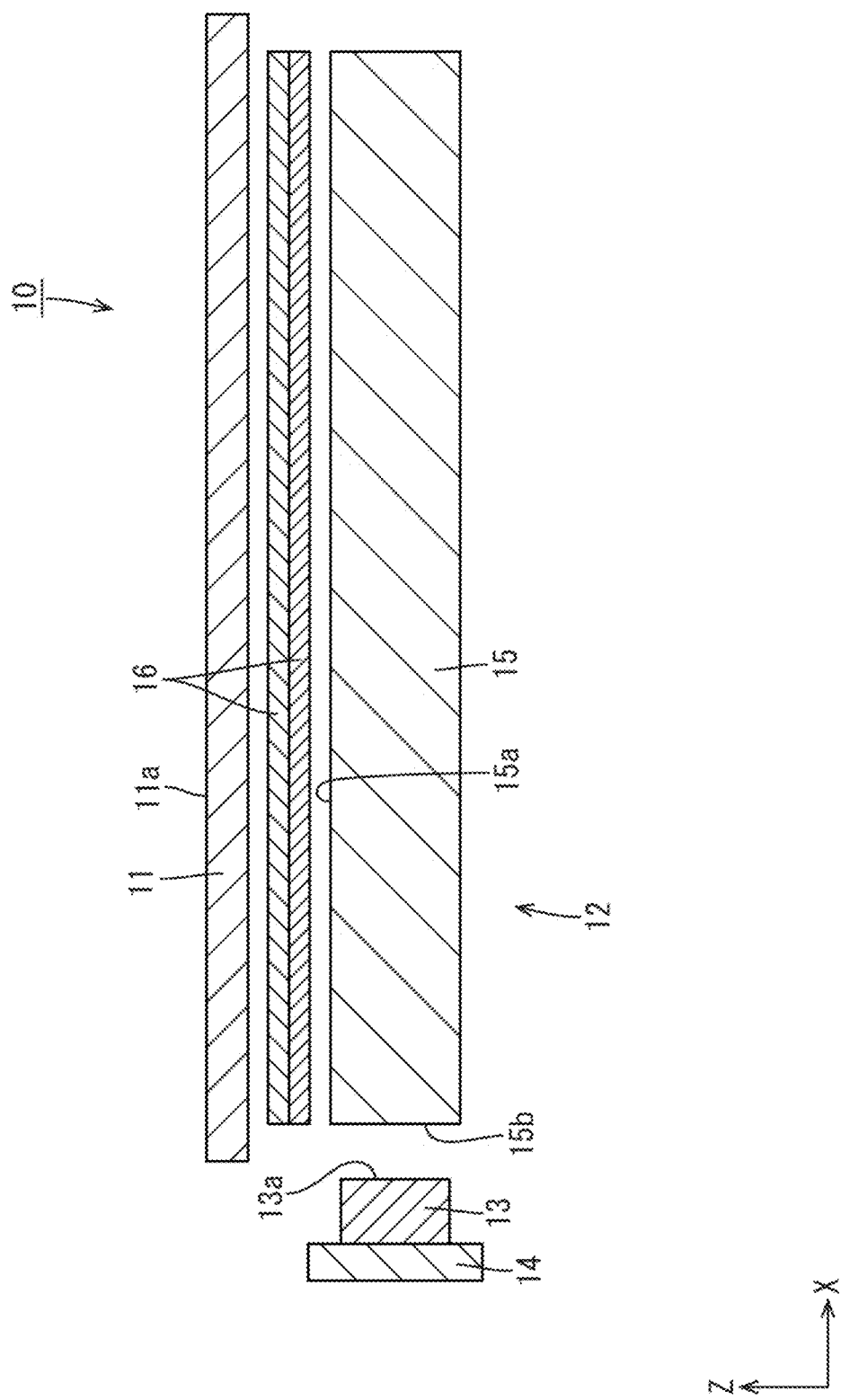
FIG. 4 is a cross-sectional view of the liquid crystal display device.

The liquid crystal panel 11 and the backlight device 12, which constitute the liquid crystal display device 10, are described in sequence. As illustrated in FIG. 2, the liquid crystal panel 11 has a plate surface facing the lens RE and serving as a display surface 11a on which an image is displayed. As illustrated in FIGS. 3 and 4, the liquid crystal panel 11 has a square plate shape as a whole and includes at least two glass substrates bonded together with a predetermined gap therebetween and a liquid crystal layer, sealed in between the glass substrate, that contains liquid crystal molecules of a substance that changes in optical property in the presence of the application of an electric field. One of the glass substrates (array substrate, active matrix substrate) is provided with a planar arrangement of switching elements (e.g. TFTs) and pixel electrodes in rows and columns (matrix), an alignment film, and the like. The switching elements are connected to source lines and gate lines that are perpendicular to each other. The pixel electrodes are disposed in substantially square regions surrounded by the source lines and the gate lines. The pixel electrodes are connected to the switching elements. The other glass substrate (common substrate, CF substrate) is provided with a planar arrangement of color filters of three colors, namely R (red), G, (green), and B (blue), in rows and columns in a predetermined array, a light blocking layer (black matrix), a solid common electrode, and an alignment film. The light blocking layer is formed in a grid to be disposed between adjacent color filters. The common electrode faces the pixel electrodes.

In this liquid crystal panel 11, R, G, and B color filters arranged along an X-axis direction (row direction, direction of extension of the gate lines) and three pixel electrodes facing the respective color filters constitute pixels of three colors, respectively, and these pixels of three colors constitute a display pixel that is capable of a color display of a predetermined tone. In the liquid crystal panel 11, a large number of pixels constitute one pixel group by being arranged along the X-axis direction, and a large number of these pixel groups are arranged along a Y-axis direction (column direction). As a result, the display surface 11a of the liquid crystal panel 11 has large numbers of pixels arranged in rows and columns. The aforementioned gate lines extend along the X-axis direction, which is a direction of arrangement of a large number of pixels that constitute a pixel group, and serve to collectively drive switching elements connected to a large number of pixels that constitute a pixel group. A large number of these gate lines are arranged in such a manner as to be individually connected to a large number of pixel groups arranged along the Y-axis direction and, in accordance with signals that are supplied from a control substrate (not illustrated), are enabled to sequentially scan a large number of pixel groups arranged along the Y-axis direction. The number of pixel groups that are arranged (number of scans) is "1080" in a configuration in which the liquid crystal panel 11 has a 2K resolution or is "2160" in a configuration in which the liquid crystal panel 11 has a 4K resolution. Furthermore, polarizing plates are placed outside the two glass substrates, respectively. It should be noted that FIG. 3 illustrates the outer shape of the liquid crystal panel 11 with chain double-dashed lines.

Next, the backlight device 12 is described. As illustrated in FIGS. 3 and 4, the backlight device 12 has a horizontally long square shape as a whole and includes at least LEDs (light sources) 13, LED substrates (light source substrates) 14 mounted with the LEDs 13, a light guide plate 15 that guides light from the LEDs 13, and an optical sheet (optical member) 16 stacked on a front side of the light guide plate 15. This backlight device 12 is a two-side light entrance edge-lighting (side-lighting) backlight device in which light from the LEDs 13 enters the light guide plate 15 through two sides. It should be noted that the backlight device 12 has its long side direction corresponding to the X-axis direction, its short side direction corresponding to the Y-axis direction, and its thickness direction corresponding to a Z-axis direction of each drawing.

Figure 5:
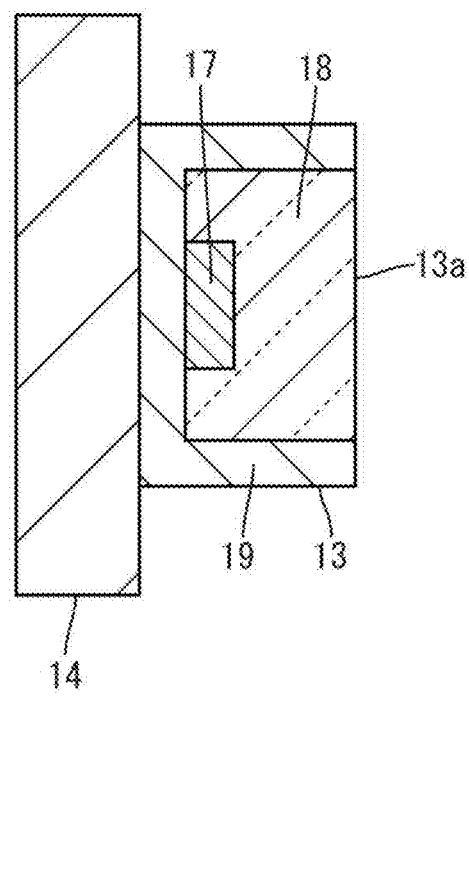
FIG. 5 is a cross-sectional view of an LED and an LED substrate.

As illustrated in FIGS. 3 and 4, each of the LEDs 13 is a top-emitting LED that is surface-mounted on an LED substrate 14. The LEDs 13 include light emitting surfaces 13a that face away from the LED substrate 14. In particular, as illustrated in FIG. 5, each of the LEDs 13 includes at least a blue LED element (blue light emitting element, blue LED chip) 17 serving as a light emitting source, a sealant 18 used for sealing the blue LED element 17, and a case (container, housing) 19, filled with the sealant 18, that houses the blue LED element 17. The blue LED element 17 is a semiconductor composed of a semiconductor material such as InGaN and, in the presence of the application of a voltage in the forward direction, emits blue light of a wavelength included in a blue wavelength region (approximately 420 nm to approximately 500 nm). Specifically, it is preferable, but is not always necessary, that the blue LED element 17 have a dominant emission wavelength of approximately 450 nm. The sealant 18 is constituted by dispersedly blending a green phosphor and a red phosphor (both not illustrated) into a substantially transparent thermosetting resin material (such as an epoxy resin material) in predetermined proportions, respectively. The green phosphor emits green light of a wavelength included in a green wavelength region (approximately 500 nm to approximately 570 nm) upon excitation by the blue light emitted from the blue LED element 17. Specifically, it is preferable, but is not always necessary, that the green phosphor be for example β-SiAlON, which is a type of SiAlON phosphor, and have a dominant emission wavelength of approximately 540 nm. The red phosphor emits red light of a wavelength included in a read wavelength region (approximately 600 nm to approximately 780 nm) upon excitation by the blue light emitted from the blue LED element 17. The red phosphor will be described in detail later. Accordingly, emitted light from an LED 13 contains blue light (blue component of light) that is emitted from the blue LED element 17, green light (green component of light) that is emitted from the green phosphor, and red light (red component of light) that is emitted from the red phosphor, and basically exhibits a color of white as a whole. The case 19 has a substantially box shape as a whole with an opening facing in the same direction as light exits (i.e. in the same direction as the light emitting surface 13*a* faces), and houses the blue LED element 17 and the sealant 18 inside.

As illustrated in FIGS. 3 and 4, each of the LED substrates 14 has a longitudinal plate shape that extends along the Y-axis direction (transverse direction of the backlight device 12), and has a plate surface that faces the light guide plate 15 and on which a plurality of (in FIG. 3, five) the LEDs 13 are mounted in such a manner as to be arranged at substantially equal spacings along the Y-axis direction. The LED substrates 14 are placed in pairs in such positions that the light guide plate 15 is interposed between the LED substrates 14 in the X-axis direction (longitudinal direction of the backlight device 12). Each of the LED substrates 14 has an LED 13 mounting surface formed with a wiring pattern (not illustrated) that serially connects a plurality of the LEDs 13 and provided with a connector (not illustrated) to which a second end of a wiring member (not illustrated) whose first end is connected to an external LED drive circuit board is connected.

The light guide plate 15 is made of a substantially transparent synthetic resin material (e.g. acrylic resin such as PMMA or the like) that has a sufficiently higher refractive index than air. As illustrated in FIGS. 3 and 4, the light guide plate 15 has a flat plate shape and has its plate surfaces parallel to the plate surface (a display surface 11*a*) of the liquid crystal panel 11). The plate surfaces of the light guide plate 15 include a front plate surface that faces the liquid crystal panel 11 and the optical sheet 16 and serves as a light exit plate surface 15*a* through which light guided through inside exits. The light guide plate 15 is placed directly below the liquid crystal panel 11 and the optical sheet 16, and has outer peripheral end faces including two short-side end faces serving as two light entrance end faces 15*b* that face the mounting surfaces of the LED substrates 14 and the light emitting surface 13*a* of the LEDs 13 mounted on the mounting surfaces and through which light from the light emitting surfaces 13*a* enters. Moreover, the light guide plate 15 has a function of introducing, through the light entrance end faces 15*b*, light emitted from the LEDs 13 toward the light guide plate 15 along the X-axis direction (direction of arrangement of the LEDs 13 and the light guide plate 15) and, after having propagated the light inside, raising the light along the Z-axis direction (direction of arrangement of the liquid crystal panel 11, the optical sheet 16, and the light guide plate 15) to cause the light to exit through the light exit plate surface 15*a* toward the optical sheet 16 (i.e. toward the front side or light exit side).

As illustrated in FIG. 4, the optical sheet 16 is interposed between the liquid crystal panel 11 and the light guide plate 15 so as to transmit emitted light from the light guide plate 15 and, while giving a predetermined optical effect to the transmitted light, cause the light to exit toward the liquid crystal panel 11. The optical sheet 16 includes a plurality of (in this embodiment, two) optical sheets specific types of which include, for example, a diffusion sheet, a lens sheet (prism sheet), a reflective polarizing sheet, and the like that can be selected as appropriate for use.

Figure 6:
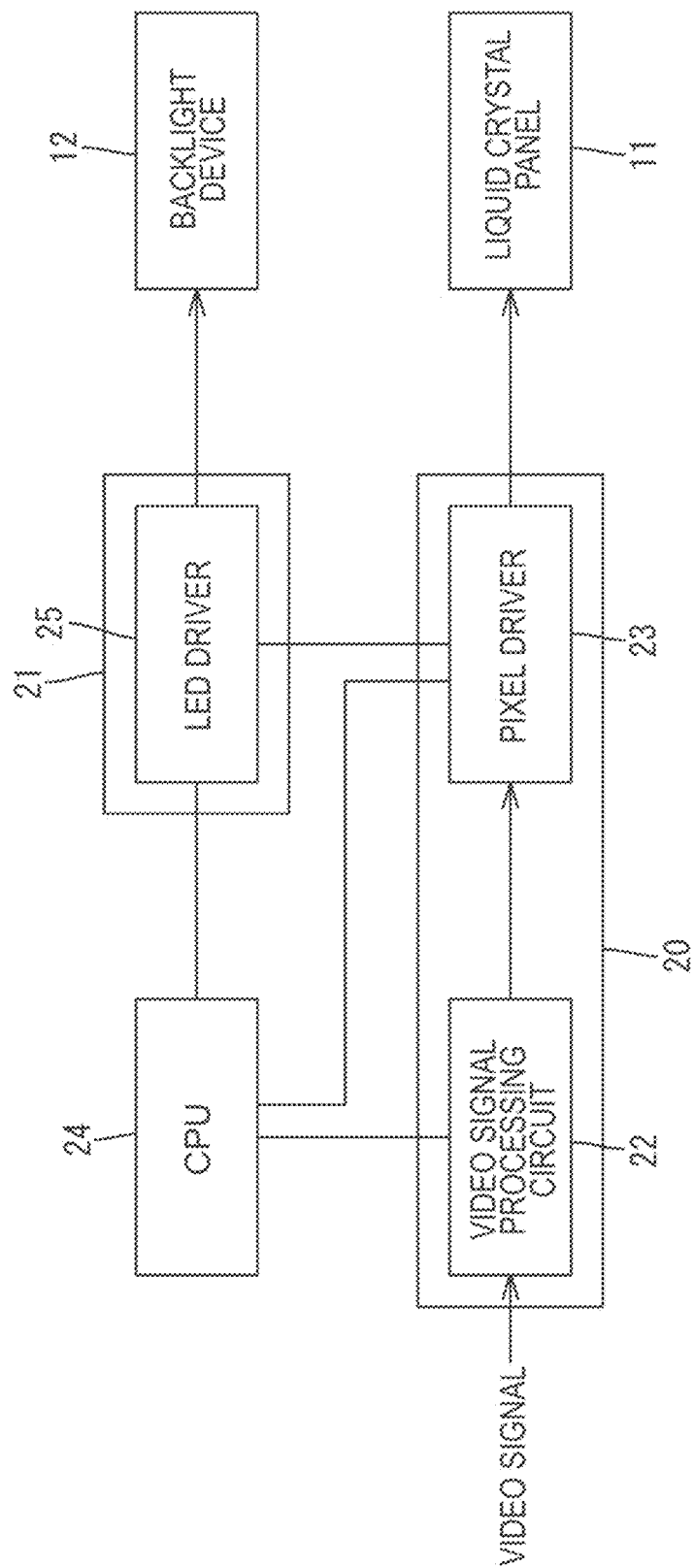
FIG. 6 is a block diagram illustrating control of a liquid crystal panel and the backlight device.

As illustrated in FIG. 6, the liquid crystal display device 10 according to this embodiment includes at least a panel controller 20 for controlling the driving of the liquid crystal panel 11 and a backlight controller (lighting controller) 21 for controlling the driving of the backlight device 12. The panel controller 20 includes a video signal processing circuit 22 that processes a video signal and a pixel driver 23 that drives each pixel in accordance with an output signal from the video signal processing circuit 22, and is provided on the control substrate. The control substrate is provided with a CPU 24 that separately controls how the video signal processing circuit 22, the pixel driver 23, and the aftermentioned LED driver 25 operate. Note here that in a configuration in which the refresh rate of an output signal processed by the video signal processing circuit 52 is for example 75 Hz, a one-frame display period is ⅟₇₅ sec (approximately 13.33 msec (milliseconds)). It should be noted that specific numerical values of the refresh rate and a one-frame display period may be changed as appropriate to numerical values other than those mentioned above. The backlight controller 21 includes an LED driver 25 that drives the LEDs 13 in accordance with an output signal from the video signal processing circuit 22, and is provided on the LED drive circuit board. The LED driver 25 operates under control of the CPU 24 of the control substrate, and operates in synchronization with the pixel driver 23.

Figure 7:
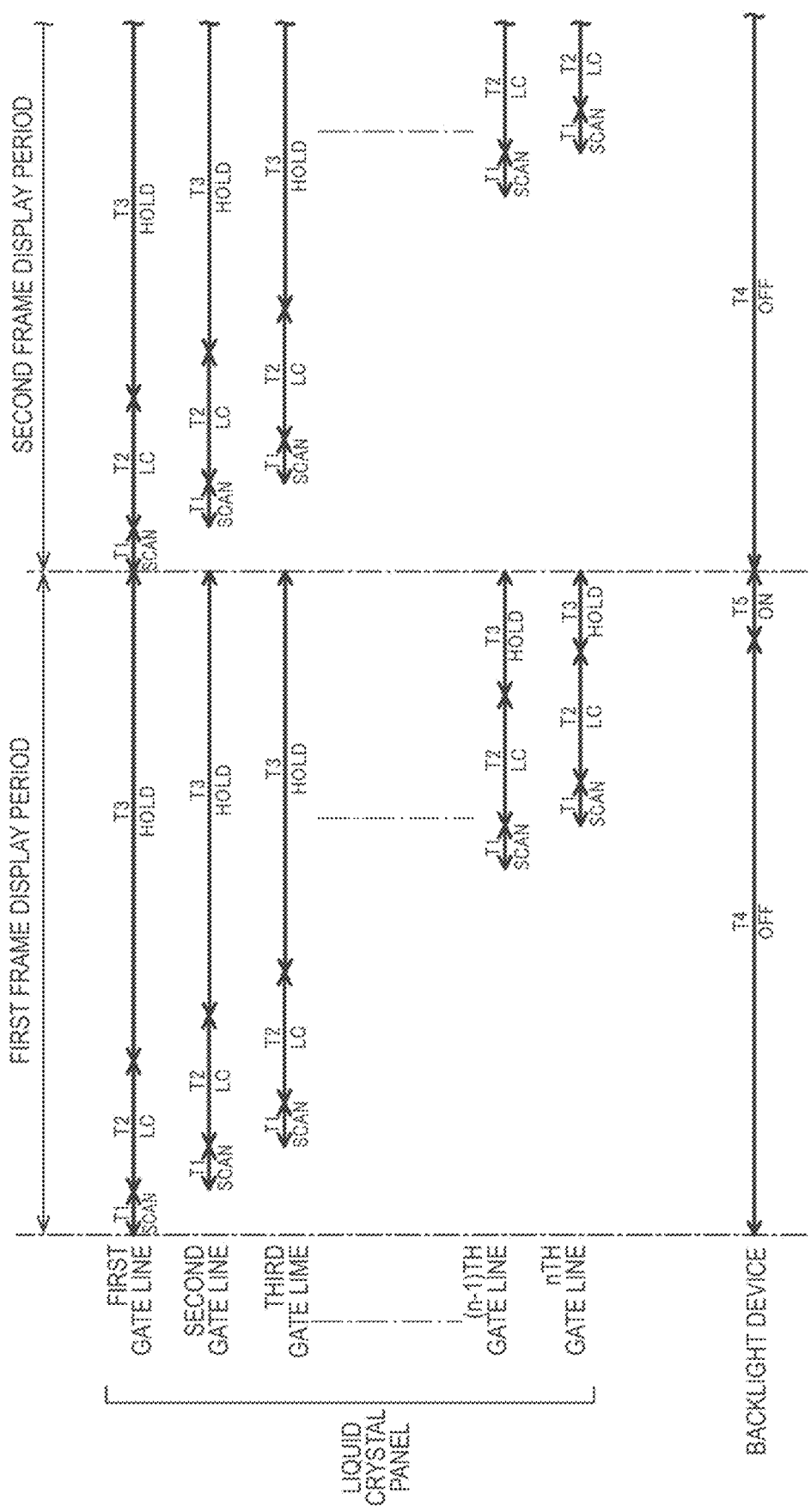
FIG. 7 is a diagram illustrating timings related to the control of the liquid crystal panel and the backlight device.

Specifically, as illustrated in FIG. 7, the panel controller 20 uses the pixel driver 23 to sequentially drive a large number of pixel groups arranged along the Y-axis direction from a pixel group located at one end to a pixel group located at the other end and, in driving the pixel groups, sequentially supply scanning signals to a large number of gate lines arranged along the Y-axis direction and supply image signals to a large number of source lines, respectively, arranged along the X-axis direction. It should be noted that FIG. 7 assumes that a total of n gate lines arranged along the Y-axis direction include a "first gate line" located at one end in the Y-axis direction (upper end in a vertical direction), a "second gate line" located closer to the other end than the first gate line, a "third gate line" located closer to the other end than the second gate line, and an "nth gate line" located at the other end in the Y-axis direction (lower end in the vertical direction). Furthermore, "n=1080" in a configuration in which the liquid crystal panel 11 has a 2K resolution, and "n=2160" in a configuration in which the liquid crystal panel 11 has a 4K resolution. The panel controller 20 is configured such that the unit scan period T1 (denoted by "SCAN" in FIG. 7) of each pixel group by the pixel driver 23 takes on a numerical value obtained by dividing a total of scan periods of all pixel groups by the total number of gate lines (pixel groups). In this embodiment, the total of scan periods is approximately 8.33 msec; therefore, the unit scan period T1 is approximately 7.72 μsec (microseconds) in a configuration in which the liquid crystal panel 11 has a 2K resolution or is approximately 3.86 μsec in a configuration in which the liquid crystal panel 11 has a 4K resolution. Once a large number of pixels included in the pixel groups are collectively driven as the gate lines are scanned and an electric field based on images signals of the source lines is applied to the liquid crystal layer, the liquid crystal molecules contained in the liquid crystal layer shift from a first alignment state to a second alignment state corresponding to the electric field. The time it takes for this change in alignment of the liquid crystal layer to take place is a liquid crystal response time T2 (denoted by "LC" in FIG. 7) that is specifically for example approximately 4 msec in this embodiment. As a result of a change in alignment of the liquid crystal molecules contained in the liquid crystal layer to the second alignment state, each pixel included in the pixel groups transmits, with a transmittance based on the second alignment state of the liquid crystal molecules, light that is supplied from the backlight device 12 described next, thereby performing a display with a predetermined tone. A hold period T3 (denoted by "HOLD" in FIG. 7) during which the second alignment state of the liquid crystal molecules is held in each pixel constituting the pixel groups takes on a numerical value obtained by subtracting the unit scan period T1 and the liquid crystal response time T2 from the one-frame display period. Once the first frame display period ends and a shift to the second frame display period is made, a scan and the like are performed again on each pixel group by the pixel driver 23 and each gate line. It should be noted that specific numerical values of a unit scan period T1, a liquid crystal response time T2, and a hold period T3 may be changed as appropriate.

As illustrated in FIG. 7, the backlight controller 21 controls the driving of each LED 13 so that a one-frame display period in the liquid crystal panel 11, whose driving is controlled by the panel controller 20, includes a turn-off period T4 (denoted by "OFF" in FIG. 7) and a turn-on period T5 (denoted by "ON" in FIG. 7). Specifically, the backlight controller 21 controls the driving of each LED 13 so that a turn-off period 14 starts in synchronization with the start of a one-frame display period and a turn-on period T5 starts after the end of the turn-off period 14 and ends in synchronization with the end of the one-frame display period. The pluralities of LEDs 13 mounted on the LED substrates 14 are collectively controlled by the backlight controller 21 so that a turn-off period T4 and a turn-on period T5 are equal. A turn-on period T5 is for example approximately 1 msec. A turn-off period T4 takes on a numerical value obtained by subtracting a turn-on period T5 from a one-frame display period, and is specifically for example approximately 12.33 msec. That is, the LEDs 13 only turn on for a short period of time before the end of a one-frame display period and stay off during the other periods. According to the configuration, the driving of the LEDs 13 by the backlight controller 21 is impulse-type driving. Therefore, an image lag is less likely to be recognized by the user during moving image display on the liquid crystal panel 11, that is, higher moving image display performance can be achieved. Specific numerical values of the turn-off period T4 and the turn-on period T5 may be altered as appropriate.

Next, the red phosphor of each of the LEDs 13 is described in detail. The red phosphor of each of the LEDs 13 according to this embodiment contains at least a complex fluoride red phosphor. The complex fluoride red phosphor is a fluoride complex red phosphor with manganese used as an activator, and a specific usable example thereof is $K_2SiF_6$ (hereinafter referred to as "KSF phosphor"). The KSF phosphor has a dominant emission wavelength of for example approximately 630 nm, and is characterized in emitting red light with higher color reproducibility and a higher brightness level. However, the KSF phosphor has a property of continuing to emit red light for a predetermined period of time even after disruption of the supply of the blue light as exciting light from the blue LED element 17 and raises concern that visual recognition of the afterglow of the red light may lead to a reduction in display quality. To address this problem, the red phosphor in each of the LEDs 13 according to this embodiment contains a nitride red phosphor mixed with the complex fluoride red phosphor. The nitride red phosphor is an alkaline-earth silicon nitride red phosphor with europium used as an activator, and a specific usable example thereof is $CaAlSiN_3$ (hereinafter referred to as "CASN phosphor"). The CASN phosphor has a dominant emission wavelength of for example approximately 650 nm, and is characterized in having a much shorter afterglow time (e.g., approximately $\frac{1}{100}$ to $\frac{1}{1000}$) than the KSF phosphor while emitting red light with much lower color reproducibility and brightness level than the KSF phosphor.

Moreover, this embodiment uses a mixture of the KSF phosphor and the CASN phosphor with the respective content ratios as the red phosphor in each of the LEDs. Specifically, the content ratio of the KSF phosphor is in a range from 50% to 85% inclusive and the content ratio of the CASN phosphor is in a range from 15% to 50% inclusive. According to such a configuration, higher color reproducibility and brightness level can be achieved for the red light higher. Furthermore, the red light is less likely to be recognized as an afterglow. Specifically, in a configuration in which the content ratio of the KSF phosphor is 50% or higher and a configuration in which the content ratio of the CASN phosphor is 50% or lower, the color reproducibility and the brightness level of the red light can be maintained sufficiently higher in comparison to a configuration in which the content ratio of the KSF phosphor is lower than 50% and the content ratio of the CASN phosphor is higher than 50%. Furthermore, in a configuration in which the content ratio of the KSF phosphor is 85% or lower and a configuration in which the content ratio of the CASN phosphor is 15% or higher, the afterglow of the red light is less likely to be recognized in comparison to a configuration in which the content ratio of the KSF phosphor is higher than 85% and the content ratio of the CASN phosphor is lower than 15%. In this embodiment, the head mounter HMDa included in the head-mounted display HMD includes the liquid crystal display device 10. Therefore, the afterglow of the red light is less likely to be recognized as mentioned above. This configuration is preferable for displaying images following the user's motion without a delay. Higher display quality can be achieved and the user is less likely to feel discomfort known as "VR sickness."

<Comparative Experiment 1>

Comparative Experiment 1 was conducted to observe how the color reproducibility and the brightness level of light emitted by an LED vary with changes in composition of a red phosphor of the LED. In Comparative Experiment 1, Comparative Example 1, Comparative example 2, Example 1, Example 2, and Example 3 were used. Comparative Example 1 includes an LED that contains a KSF phosphor with the content ratio of 100%. Comparative Example 2 includes an LED that contains a KSF phosphor with the content ratio of 90% and a CASN phosphor with the content ratio of 10%. Example 1 includes an LED 13 that contains a KSF phosphor with the content ratio of 85% and a CASN phosphor with the content ratio of 15%. Example 2 includes an LED 13 that contains a KSF phosphor with the content ratio of 75% and a CASN phosphor with the content ratio of 25%. Example 3 includes an LED 13 that contains a KSF phosphor with the content ratio of 50% and a CASN phosphor with the content ratio 50%. Comparative Example 1 does not contain a CASN phosphor. The LEDs included in Comparative Examples 1 and 2 and Examples 1 to 3 contain the red phosphors having different compositions but total amounts of the red phosphors that are contained in the sealants are equal to one another. Furthermore, components of the LEDs (such as the blue LED elements and the green phosphors) other than the red phosphors are the same. In Comparative Experiment 1, the LEDs in Comparative Examples 1 and 2 and Examples 1 to 3 were used in the liquid crystal display device 10 illustrated in FIGS. 3 and 4, and the brightness level and chromaticity on the display surface 11a of the liquid crystal panel 11 were measured with the LEDs turned on. Results of the measurements are provided in FIG. 8. In FIG. 8, values in a "RELATIVE BRIGHTNESS LEVEL (in "%")" row are relative to the brightness level on the display surface 11a on the liquid crystal panel 11 when the LED of Comparative Example 1 is used, which is defined as 100%. In FIG. 8, values in a "RELATIVE NTSC RATIO (in "%")" row are relative to the NTSC ratio on the liquid crystal panel 11 when the LED of Comparative Example 1 is used, which is defined as 100%. The NTSC ratios were defined with reference to an NTSC chromaticity region in the NTSC (National Television System Committee) standard, which is used as a reference (100%). Each of the NTSC ratios was calculated by dividing the area value of a chromaticity region obtained through measurement by the area value of the NTSC chromaticity region.

The results of Comparative Experiment 1 will be described. As illustrated in FIG. 8, the color reproducibility and the brightness level tend to improve as the content ratio of the KSF phosphor becomes higher but decrease as the content ratio of the KSF phosphor becomes lower. This is because the KSF phosphor tends to emit red light with higher color purity and emit red light with higher brightness level than the CASN phosphor. Specifically, if a content ratio of the KSF phosphor is maintained at 50% or higher as in the case of Example 3, a relative brightness level is properly maintained at 88.7% or higher and a relative NTSC ratio is properly maintained at 93.5% or higher. Therefore, sufficiently higher color reproducibility and brightness level are achieved. If the content ratio of the CASN phosphor becomes 50% or higher, the contribution of the KSF phosphor may decrease and thus the relative brightness level and the relative NTSC ratio may decrease. Accordingly, to properly achieve sufficient color reproducibility and brightness level, a preferable lower limit of the content ratio of the KSF phosphor is 50% and a preferable upper limit of the content ratio of the CASN phosphor is 50%. If a content ratio of the KSF phosphor is maintained at 75% or higher as in the case of Example 2, a relative brightness level is properly maintained at 93.4% or higher and a relative NTSC ratio is properly maintained at 94.6%. Therefore, even higher color reproducibility and brightness level can be achieved. To maintain the color reproducibility and the brightness level higher, it is preferable to set the content ratio of the KSF phosphor to 75% or higher and the content ratio of the CASN phosphor to 25% or lower.

<Comparative Experiment 2>

Comparative Experiment 2 was conducted to observe how afterglows of red light in light emitted by LEDs were visually recognized with changes in composition of red phosphors in the LEDs. In Comparative Experiment 2, Comparative Example 2 and Examples 1 to 3, which were used in Comparative Experiment 1 described above, were used. The LEDs in Comparative Example 2 and Examples 1 to 3 contain the red phosphors having different compositions but total amounts of the red phosphors in the sealants are equal to one another. Furthermore, components of the LEDs (such as the blue LED elements and the green phosphors) other than the red phosphors are the same, as in Comparative Experiment 1. Moreover, in Comparative Experiment 2, the LEDs included in Comparative Example and 2 and Examples 1 to 3 were used in the liquid crystal display device 10 illustrated in FIGS. 3 and 4. Degrees of afterglows of red light on the display surface 11a of the liquid crystal panel 11 were subjectively evaluated by ten observers after each LED had been turned on and then turned off. Results of the evaluations are provided in FIG. 9. In FIG. 9, the degrees of the afterglows are expressed by three conditions, namely x (Poor), Δ (Average), and ○ (Good), in consideration of display quality based on the afterglows. The evaluation was no performed on Comparative Example 1. Comparative Example 1 is present in FIG. 9 for reference.

Results of Comparative Experiment 2 will be described. As illustrated in FIG. 9, the afterglows of red light are less likely to be recognized as the content ratio of the CASN phosphor becomes higher and are more likely to be recognized as the content ratio of the CASN phosphor becomes lower. This is because the CASN phosphor has a shorter red light afterglow time of approximately $\frac{1}{100}$ to $\frac{1}{1000}$ than the KSF phosphor and therefore is higher in responsiveness than the KSF phosphor. Specifically, in Comparative Example 2, in which the CASN phosphor is contained with a content ratio of 10%, the red light afterglow time may have become shorter but is still longer than an LED turn-on period T5 (see FIG. 7), so that the afterglow of red light is more likely to be recognized. Therefore, the result of the evaluation may be rated x (Poor). On the other hand, if the content ratio of the CASN phosphor is 15% as in Example 1, the red light afterglow time becomes further shorter, that is, closer to an LED turn-on period T5. Therefore, the user may be less likely to recognize the afterglow of red light. The display quality may be improved and thus the result of the evaluation may be rated Δ (Average). Furthermore, in a configuration in which the content ratio of the CASN phosphor is 25% as in Example 2 and a configuration in which the content ratio of the CASN phosphor is 50% as in Example 3, the red light afterglow time may become significantly shorter. This may be a reason why the red light afterglow time has become shorter than an LED turn-on period T5 and a liquid crystal response time T2. According to the configuration, the possibility of the afterglow of red light to be recognized by the user can be properly reduced and thus significantly higher display quality can be achieved. This may be a reason why the result of the evaluation is rated ○ (Good). To properly reduce the afterglow of red light while the color reproducibility and the brightness level are properly maintained, it is preferable to set the content ratio of the CASN phosphor to 25% and the content ratio of the KSF phosphor to 75%.

As described above, a liquid crystal display device (a display device) 10 in this embodiment includes: a liquid crystal panel (display panel) 11 configured to display an image; a backlight device (a lighting device) 12 configured to supply light to the liquid crystal panel 11 for image display; an LED (a light source) 13 included in the backlight device 12 including at least a blue LED element (a blue light emitting element) 17 configured to emit blue light and a red phosphor configured to emit red light when excited by the blue light from the blue LED element 17; a backlight controller (a lighting controller) 21 configured to control the driving of the LED 13 in synchronization with the image display by the liquid crystal panel 11 so that a one-frame display period in the liquid crystal panel 11 includes a turn-on period T5 and a turn-off period 14; a complex fluoride red phosphor that constitutes the red phosphor and has a content ratio in a range from 50% to 85% inclusive; and a nitride red phosphor that constitutes the red phosphor and has a content ratio in a range from 15% to 50% inclusive.

According to the configuration, the light is supplied to the liquid crystal panel 11 by the backlight device 12 that includes LED 13, the driving of which is controlled by the backlight controller 21. An image is displayed on the liquid crystal panel 11 using the light. The LED 13 in the backlight device 12 includes at least the blue LED elements 17 configured to emit blue light and the red phosphor configured to emit the red light when excited by the blue light from the blue LED elements 17. The red phosphor contains the complex fluoride red phosphor. This makes the color reproducibility and the brightness level of the red light higher.

The backlight controller 21 controls the driving of the LED 13 in synchronization with the image display by the liquid crystal panel 11. In particular, the backlight controller 21 controls the driving of the LED 13 so that a one-frame display period in the liquid crystal panel 11 includes a turn-on period T5 and a turn-off period 14. Therefore, the user is less likely to recognize an image lag during moving image display on the liquid crystal panel 11, that is, higher moving image display performance can be achieved. Even when the backlight controller 21 controls the LED 13 to shift from the turn-on state to a turn-off state, the complex fluoride phosphor of the red phosphor in the LED 13 has a property of continuing to emit red light for a predetermined period of time even after disruption of the supply of the blue light as exciting light from the blue LED element 17 and therefore raises concern that the red light may be visually recognized as an afterglow. In contrast, since the red phosphor contains the nitride red phosphor in addition to the complex fluoride red phosphor, this makes the color reproducibility and the brightness level of the red light higher. Furthermore, the red light is less likely to be recognized as an afterglow. Specifically, in a configuration in which the content ratio of the complex fluoride red phosphor is 50% or higher and a configuration in which the content ratio of the nitride red phosphor is 50% or lower, the color reproducibility and the brightness level of the red light are maintained sufficiently higher in comparison to a configuration in which the content ratio of the complex fluoride red phosphor is lower than 50% and the content ratio of the nitride red phosphor is higher than 50%. Furthermore, according to a configuration in which the content ratio of the complex fluoride red phosphor is 85% or lower and a configuration in which the content ratio of the nitride red phosphor is 15% or higher, the afterglow of the red light is less likely to be recognized in comparison to a configuration in which the content ratio of the complex fluoride red phosphor is higher than 85% and the content ratio of the nitride red phosphor is lower than 15%.

Furthermore, the content ratio of the complex fluoride red phosphor is in a range from 75% to 85% inclusive, the content ratio of the nitride red phosphor is in a range from 15% to 25% inclusive. In a configuration in which the content ratio of the complex fluoride red phosphor is 75% or higher and a configuration in which the content ratio of the nitride red phosphor is 25% or lower, the color reproducibility and the brightness level of the red light are maintained sufficiently higher in comparison to a configuration in which the content ratio of the complex fluoride red phosphor is lower than 75% and the content ratio of the nitride red phosphor is higher than 25%. Furthermore, according to the configuration in which the content ratio of the complex fluoride red phosphor is 85% or lower and the configuration in which the content ratio of the nitride red phosphor is 15% or higher, the afterglow of the red light is less likely to be recognized in comparison to a configuration in which the content ratio of the complex fluoride red phosphor is higher than 85% and the content ratio of the nitride red phosphor is lower than 15%.

Furthermore, the content ratio of the complex fluoride red phosphor is 85% and the content ratio of the nitride red phosphor is 15%. According to the configuration, significantly higher color reproducibility and brightness level can be achieved for the red light. Furthermore, a possibility of the afterglow of the red light to be recognized can be sufficiently reduced.

Furthermore, the content ratio of the complex fluoride red phosphor is 75% and the content ratio of the nitride red phosphor is 25%. According to the configuration, the possibility of the afterglow of the red light to be recognized can be properly reduced.

Furthermore, the complex fluoride red phosphor is a fluoride complex red phosphor with manganese used as an activator. This configuration is preferable for maintaining the color reproducibility and the brightness level of the red light higher.

Furthermore, the nitride red phosphor is an alkaline-earth silicon nitride red phosphor with europium used as an activator. This configuration is preferable for reducing the possibility of the afterglow of the red light to be recognized.

Furthermore, the backlight controller 21 controls the driving of the LED 13 so that the turn-off period 14 starts in synchronization with the start of the one-frame display period and the turn-on period T5 starts after the end of the turn-off period 14 and ends in synchronization with the end of the one-frame display period. According to the configuration, the diving of the LED 13 by the backlight controller 21 is impulse-type driving. Therefore, an image lag is less likely to be recognized by the user during moving image display on the liquid crystal panel 11, that is, higher moving image display performance can be achieved.

Furthermore, the head-mounted display HMD according to this embodiment includes at least the display device described above, the lens RE, and the head mounter HMDa. Through the lens RE, the image of the displayed image on the liquid crystal display device 10 is formed in an eyeball (eye) EY of a user. The head mounter HMDa is to be mounted on the head HD of the user. The head mounter HMDa includes the liquid crystal display device 10 and the lens RE. When the head-mounted display HMD having such a configuration is used with the head mounter HMDa mounted on the head HD, the image of the displayed image on the liquid crystal display device 10 is formed in the eyeball EY of the user through the lens RE. The user views a magnified image of the displayed image on the liquid crystal display device 10. In the liquid crystal display device 10 includes in the head mounter HMDa, the afterglow of the red light is less likely to be recognized. This configuration is preferable for displaying images following the user's motion without a delay. Higher display quality can be achieved and the user is less likely to feel discomfort known as "VR sickness."

Second Embodiment

A second embodiment of the present invention will be described with reference to FIGS. 10 to 12. The second embodiment includes a backlight device 112 having different structural and control configurations. Configurations, functions, and effects similar to those of the first embodiment will not be described.

Figure 10:
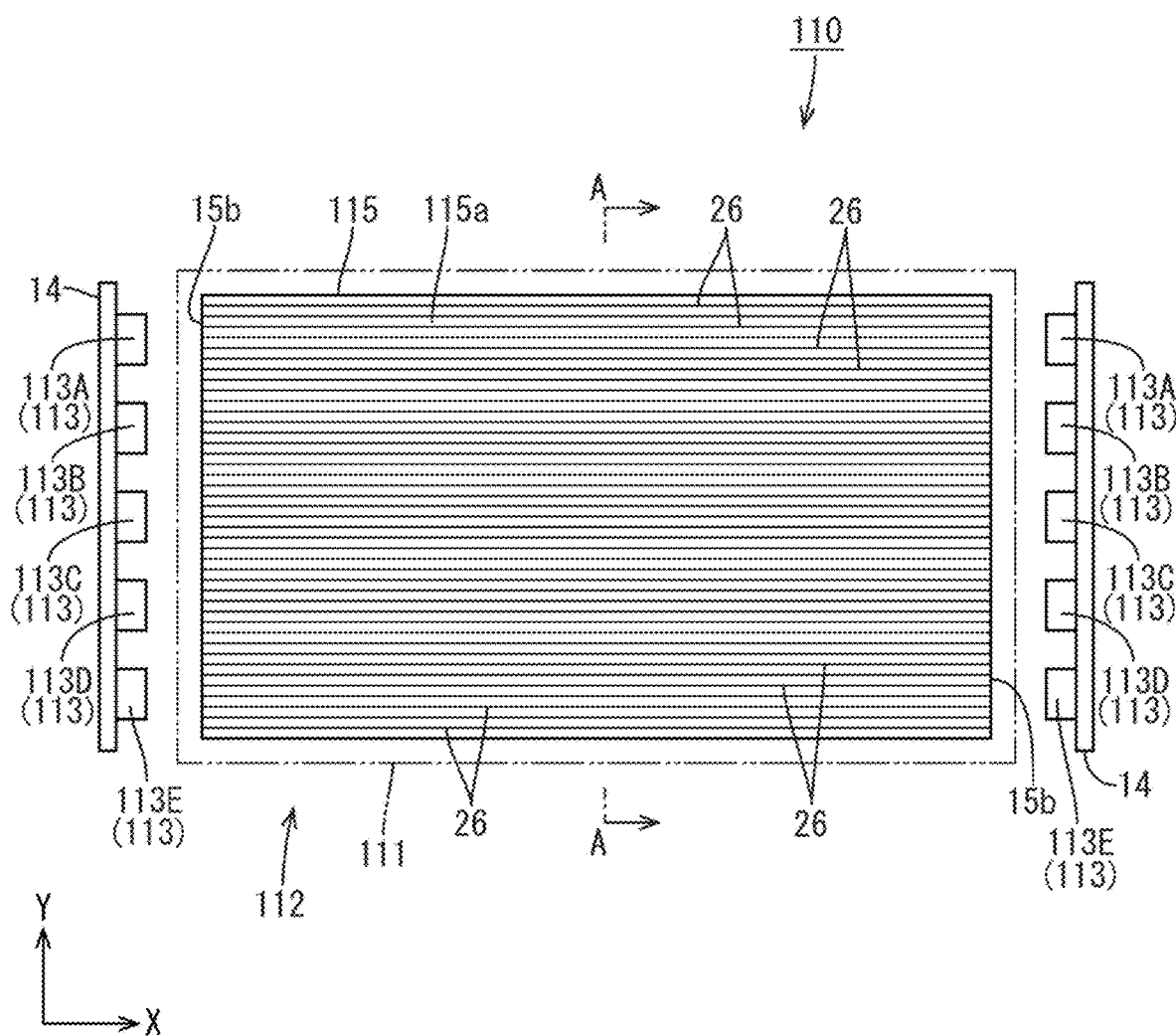
FIG. 10 is a plan view of a backlight device of a liquid crystal display device according to a second embodiment of the present invention.
Figure 11:
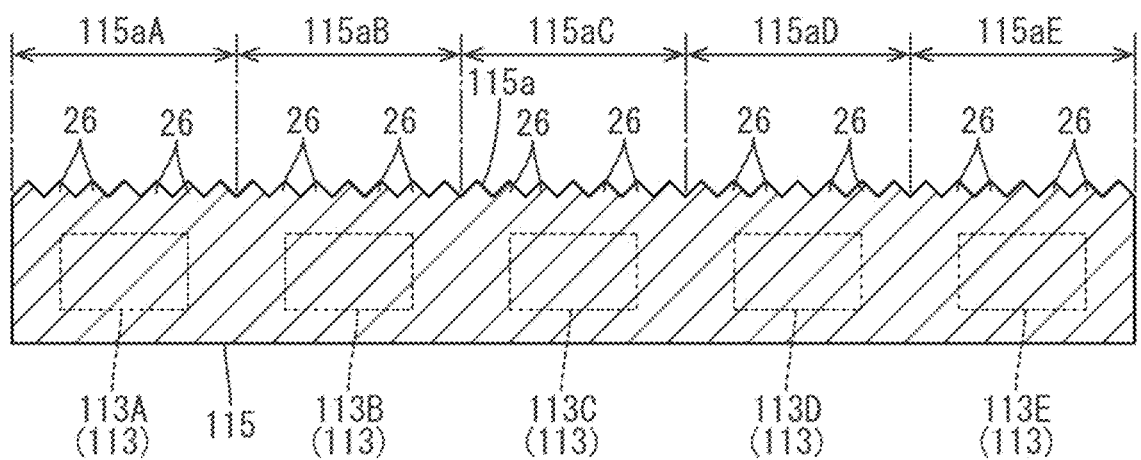
FIG. 11 is a cross-sectional view taken along line A-A in FIG. 10.

The backlight device 112 in this embodiment includes a light guide plate 115 that includes prisms 26 (a directional light guide) on a light exit plate surface 115a as illustrated in FIGS. 10 and 11. Each of the prisms 26 is a projection having a substantially triangular (right-angled triangular) cross section. The prisms 26 linearly extend along the X-axis direction (direction normal to a light emitting surface 113a of an LED 113) to form ridges. The prisms 26 are arranged along the Y-axis direction in a plane of the light exit plate surface 115a. Each of the prisms 26 includes a vertex with a substantially right angle. Therefore, light having propagated through the light guide plate 115 and totally reflected at an interface of the prism 26 is limited in range of diffusion of the light in the Y-axis direction (direction of arrangement of LEDs 113, scanning direction of the gate lines) and is thereby given such a directivity as to travel substantially straight along the X-axis direction. That is, the prism 26 gives, to light introduced into the light guide plate 115 from the LEDs 113, the directivity to regulate diffusion of the light in the Y-axis direction. Moreover, selectively turning on any of a plurality of LEDs 113 arranged along the Y-axis direction causes light to be selectively emitted from a horizontally long band region of the light exit plate surface 115a of the light guide plate 115 corresponding to a range of illumination of the LED 113 thus selected and causes little light to be emitted from the other regions (i.e. regions corresponding to ranges of illumination of the LEDs 113 that were not selected). In this embodiment, the light exit plate surface 115a of the light guide plate 115 is segmented into as many horizontally long band regions as LEDs 113 arranged, i.e. into five horizontally long band regions, and these five divided regions selectively emit light according to the turn-on of five LEDs 113. The present embodiment assumes that five LEDs 113 arranged along the Y-axis direction consist of a first LED 113A, a second LED 113B, a third LED 113C, a forth LED 113D, and a fifth LED 113E, starting from the top of FIG. 10 (i.e. the left of FIG. 11). Accordingly, the five regions into which the light exit plate surface 115a of the light guide plate 115 is segmented consist of a first segmented region 115aA that allows emission of light from the first LED 113A, a second segmented region 115aB that allows emission of light from the second LED 113B, a third segmented region 115aC that allows emission of light from the third LED 113C, a fourth segmented region 115aD that allows emission of light from the fourth LED 113D, and a fifth segmented region 115aE that allows emission of light from the fifth LED 113E, starting from the top of FIG. 10 (i.e. the left of FIG. 11).

As illustrated in FIGS. 10 and 11, light emitted from each of the segmented regions 115aA to 115aE of the light exit plate surface 115a of the light guide plate 115 is selectively supplied to a plurality of particular pixel groups of a large number of pixel groups of a liquid crystal panel 111. That is, the large number of pixel groups of the liquid crystal panel 111 are divided into a first pixel group overlapped with the first segmented region 115aA and composed of a plurality of pixel groups that are selectively supplied with light from the first segmented region 115aA, a second pixel group overlapped with the second segmented region 115aB and composed of a plurality of pixel groups that are selectively supplied with light from the second segmented region 115aB, a third pixel group overlapped with the third segmented region 115aC and composed of a plurality of pixel groups that are selectively supplied with light from the third segmented region 115aC, a fourth pixel group overlapped with the fourth segmented region 115aD and composed of a plurality of pixel groups that are selectively supplied with light from the fourth segmented region 115aD, and a fifth pixel group overlapped with the fifth segmented region 115aE and composed of a plurality of pixel groups that are selectively supplied with light from the fifth segmented region 115aE. Let it be assumed here that a total of n gate lines include a "first gate line" located at one end in the Y-axis direction and an "nth gate line" located at the other end in the Y-axis direction, as is the case with the first embodiment described above. Then, the first pixel group is scanned by the first to (n/5)th gate lines, the second pixel group is scanned by the (n/5+1)th to (2n/5)th gate lines, the third pixel group is scanned by the (2n/5+1)th to (3n/5) gate lines, the fourth pixel group is scanned by the (3n/5+1)th to (4n/5) gate lines, and the fifth pixel group is scanned by the (4n/5+1)th to nth gate lines.

Figure 12:
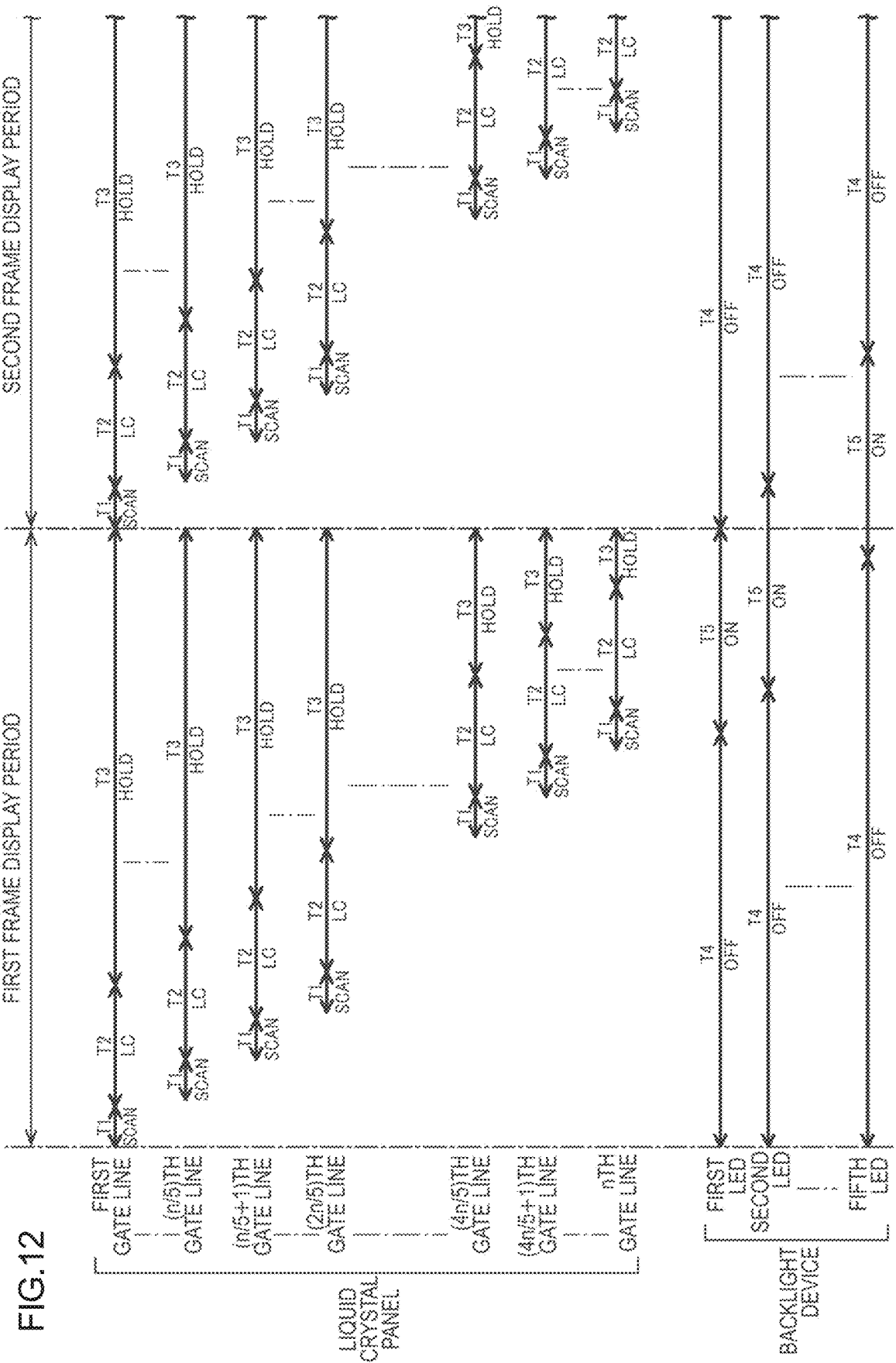
FIG. 12 is a diagram for explaining timings pertaining to control of a liquid crystal panel and the backlight device.

Moreover, as illustrated in FIG. 12, a backlight controller (not illustrated in this embodiment, see FIG. 6) according to this embodiment controls the driving of the plurality of LEDs 113 in synchronization with the driving of a pixel group to be supplied with light so that a turn-off period T4 and a turn-on period T5 are included in a period during which the plurality of pixel groups are being driven while being sequentially scanned by a panel controller (not illustrated in this embodiment, see FIG. 6). Specifically, until the start of a hold period T3 during which the second alignment state of the liquid crystal molecules is held while the plurality of pixel groups constituting the first pixel group are driven by being scanned by the first to (n/5) th gate lines, the first LED 113A of the backlight device 112 is maintained in a turn-off period T4, and after a predetermined period of time has elapsed since the start of the hold period T3, a shift to a turn-on period T5 is made. Similarly, until the start of a hold period T3 during which the second alignment state of the liquid crystal molecules is held while the plurality of pixel groups constituting the second pixel group are driven by being scanned by the (n/5+1)th to (2n/5)th gate lines, the second LED 113B of the backlight device 112 is maintained in a turn-off period T4, and after a predetermined period of time has elapsed since the start of the hold period T3, a shift to a turn-on period T5 is made. At this time, the turn-on period T5 of the second LED 113B starts later than the turn-on period T5 of the first LED 113A. The timings of turn-off periods T4 and turn-on periods T5 of the third, fourth, and fifth LEDs 113C, 113D, and 113E are determined in the same way as above in synchronization with the scanning and driving of the third, fourth, and fifth pixel groups. It should be noted that the respective turn-on periods T5 of the LEDs 113A to 113E are all equal, and some of them extend over both the first frame display period and the second frame display period. As noted above, the backlight controller controls the driving of the LEDs 113A to 113E in synchronization with the scanning of the respective pixel groups by the panel controller. The user is less likely to recognize an image lag during moving image display, that is, higher moving image display performance can be achieved. In a liquid crystal display device 110 thus configured, each of the LEDs 113 contains a red phosphor constituted by a mixture of a KSF phosphor and a CASN phosphor. Whereas the content ratio of the KSF phosphor is in a range of 50% or higher to 85% or lower, and the content ratio of the CASN phosphor is in a range of 15% or higher to 50% or lower. This makes it possible to sufficiently attain the color reproducibility and the brightness level of red light and suppress the afterglow of the red light.

As described above, the liquid crystal display device 10 according to this embodiment further includes a panel controller (see FIG. 6) that controls the driving of the liquid crystal panel 111. Whereas the liquid crystal panel 111 includes a plurality of pixels arranged in rows and columns, the panel controller sequentially scans, along a column direction during a one-frame display period, a pixel group composed of a plurality of pixels arranged in a row direction. The backlight device 112 includes a plurality of LEDs 113 placed so as to selectively supply light to the plurality of pixel groups. The backlight controller (see FIG. 6) controls the driving of the plurality of LEDs 113 in synchronization with the driving of a pixel group to be supplied with light so that a turn-on period T5 and a turn-off period T4 are included in a period during which the plurality of pixel groups are being driven while being sequentially scanned by the panel controller. Thus, the backlight controller controls the driving of the LEDs 113 in synchronization with the scanning of the plurality of pixel groups by the panel controller. The user is less likely to recognize an image lag during moving image display on the liquid crystal panel 111, that is, higher moving image display performance can be achieved.

Other Embodiments

The present invention is not limited to the embodiments described above with reference to the drawings. The following embodiments may be included in the technical scope of the present invention.

(1) In each of the embodiments, the CASN phosphor is used as the nitride red phosphor. An SCASN phosphor ($Sr_xCa_{1-x}AlSiN_3$:Eu) may be used for the nitride red phosphor instead of the CASN phosphor.

(2) In each of the embodiments, the KSF phosphor is used as the complex fluoride red phosphor. A KSNAF phosphor ($K_2Si_{1-x}Na_xAl_xF_6$:Mn), a KTF phosphor ($K_2TiF_6$:Mn) may be used for the complex fluoride red phosphor instead of the DSF phosphor.

(3) In each of the embodiments, the red phosphor is composed only of two types of phosphors, namely, the KSF phosphor and the CASN phosphor. The red phosphor may contain three or more types of phosphors, namely, the KSF phosphor, the CASN phosphor, and an additional red phosphor. The additional red phosphor may be, but not limited to, a complex fluoride red phosphor or a nitride red phosphor.

(4) The blue LED element in the LED, the material of the green phosphor, the dominant emission wavelengths may be altered from those in each of the embodiments as appropriate. Furthermore, the sealant may contain a yellow phosphor in addition to the green phosphor and the red phosphor.

(5) In each of the embodiments five LEDs are mounted on each LED substrate. The number of LEDs that are mounted on each LED substrate may be altered from five as appropriate.

(6) In each of the embodiments, the edge-lighting backlight device includes two LED substrates (LEDs) are disposed to face short-side end faces of the light guide plate, respectively. The LED substrates (LEDs) may be disposed to face the long-side end faces of the light guide plate. One of the LED substrates (LEDs) may be disposed to face either one of the short-side end faces or either one of the long-side end faces of the outer peripheral end faces of the light guide plate. The arrangement and the number of LED substrates (LEDs) relative to the outer peripheral end faces of the light guide plate may be altered as appropriate.

(7) In each of the embodiments, the backlight controller is provided on the LED drive circuit board. The LED drive circuit board may be omitted and the backlight controller may be provided on the control substrate.

(8) In each of the embodiments, the liquid crystal display device includes the liquid crystal panel. The present invention may be applied to other types of display panel (such as a PDP (plasma display panel), an organic EL panel, an EPD (electrophoretic display panel), and a MEMS (micro electro mechanical systems) display panel).

(9) In each of the embodiment sections, the head-mounted display was described. The present invention may be applied to a head-up display or a projector that includes a lens to display an magnified image of the displayed image on the liquid crystal panel. Furthermore, the present invention may be applied to a liquid crystal display device (such as a television device, a tablet terminal, or a smartphone) which does not have a function for displaying a magnified image.

(10) In each of the embodiments, the liquid crystal display device (i.e. the liquid crystal panel and the backlight device) has the horizontally long rectangular shape in the plan view. The shape of the liquid crystal display device in the plan view may be a square, a polygon with five or more sides such as an octagon, a vertically long rectangle, a circle, a semicircle, an oval, an ellipse, a trapezoid, or other shapes.

(11) Each of the embodiments includes the top-emitting LED. Alternatively, a side-emitting LED may be used for the light source.

(12) In each of the embodiments includes the light guide plate with the light exit plate surface in the flat shape. The light exit plate surface may be provided with a prism portion that includes projections each having triangular cross sections to form ridges or a lenticular lens portion that includes projections each having semicircular cross sections (half column shapes). The prism portion or the lenticular lens portion may be provided on a plate surface of the light guide plate on an opposite side from the light exit plate surface. Alternatively, a large number of minute reflecting dots may be disposed in a predetermined distribution pattern on the plate surface of the light guide plate on the opposite side from the light exit plate surface. The reflecting dots may scatter and reflect rays of light propagating through the light guide plate so that the rays of light are more likely to exit through the light-exit plate surface. The distribution pattern may be adjusted to achieve a uniform brightness distribution of light emitted through the light exit plate surface. The configuration of the light guide plate may be altered as appropriate.

EXPLANATION OF SYMBOLS 10, 110: Liquid crystal display device (display device), 11, 111: Liquid crystal panel (display panel), 12, 112: Backlight device (a lighting device), 13, 113: LED (light source), 17: Blue LED element (blue light emitting element), 20: Panel controller, 21: Backlight controller (lighting controller), EY: Eyeball (eye), EYa: Crystalline lens (eye), EYb: Retina (eye), HD: Head, HMD: Head-mounted display, HMDa: Head mounter, RE: Lens, T4: Turn-off period, T5: Turn-on period

The invention claimed is:

1. A head-mounted display to be mounted on a head of the user, the head-mounted display comprising:
   a display panel to display an image;
   a lighting device to supply light to the display device, the lighting device including at least one light source including:
      at least a blue light emitting element emitting blue light; and
      a red phosphor to emit red light when excited by the blue light from the blue light emitting element, the red phosphor including a complex fluoride red phosphor and a nitride red phosphor having a content ratio smaller than a content ratio of the complex fluoride red phosphor;
   a lighting controller to control driving of the at least one light source in synchronization with the image display by the display device so that a one-frame display period in the display device includes a turn-on period and a turn-off period; and a lens through which an image of the image displayed on the display device is formed in an eye of a user.

2. The head-mounted display according to claim 1, wherein
the complex fluoride red phosphor includes a fluoride complex red phosphor, and
the fluoride complex red phosphor includes manganese that is an activator.

3. The head-mounted display according to claim 2, wherein the complex fluoride red phosphor includes a KSF phosphor.

4. The head-mounted display according to claim 1, wherein
the nitride red phosphor includes an alkaline-earth silicon nitride red phosphor, and
the alkaline-earth silicon nitride red phosphor includes europium that is an activator.

5. The head-mounted display according to claim 4, wherein the nitride red phosphor includes a CASN phosphor.

6. The head-mounted display according to claim 1, wherein the red phosphor emits red light of a wavelength in a range from about 600 nm to about 780 nm.

7. The head-mounted display according to claim 1, wherein the at least one light source includes a green phosphor that emits green light of a wavelength in a range from about 500 nm to about 570 nm.

8. The head-mounted display according to claim 1, wherein the green phosphor includes β-SiALON.

9. The head-mounted display according to claim 1, wherein the blue light emitting element includes a semiconductor made of a semiconductor material.

10. The head-mounted display according to claim 9, wherein the semiconductor includes InGaN.

11. The head-mounted display according to claim 1, wherein the blue light emitting element emits blue light of a wavelength in a range from about 420 nm to about 500 nm.

12. The head-mounted display according to claim 1, wherein the lighting controller controls the driving of the at least one light source to start the turn-off period in synchronization with the start of the one-frame display period and to start the turn-off period after the end of the turn-off period and to end the turn-off period in synchronization with the end of the one-frame display period.

13. The head-mounted display according to claim 1, further comprising a panel controller to control driving of the display panel, wherein
the display panel includes pixels arranged in rows,
the panel controller scans the rows of the pixels in sequence,
the at least one light source includes a plurality of light sources to supply light to the rows of the pixels, respectively, and
the lighting controller controls driving of the plurality of light sources in synchronization with driving of the respective rows of the pixels so that the turn-on period and the turn-off period are present during scanning of the rows of the pixels in sequence.

14. A display device comprising:
a display panel to display an image, the display panel comprising:
a plurality of pixel groups; and
a liquid crystal layer containing liquid crystal molecules shifting from a first alignment state to a second alignment state corresponding to an electric field applied by the plurality of pixel groups;
a lighting device to supply light to the display panel for image display, the lighting device comprising a plurality of light sources corresponding to the plurality of pixel groups;
a panel controller driving the plurality of pixel groups by sequentially scanning the plurality of pixel groups; and
a lighting controller controlling driving of the plurality of light sources in synchronization with driving the plurality of pixel groups, wherein
each light source of the plurality of light sources includes at least a blue light emitting element to emit blue light and a red phosphor to emit red light when excited by the blue light from the blue light emitting element,
the red phosphor contains a fluoride complex red phosphor with manganese used as an activator and an alkaline-earth silicon nitride red phosphor with europium used as an activator,
the fluoride complex red phosphor has a content ratio in a range from 75% to 85% inclusive and the alkaline-earth silicon nitride red phosphor has a content ratio in a range from 15% to 25% inclusive, and
the alkaline-earth silicon nitride red phosphor has a red light afterglow time of approximately $1/100$ to $1/1000$ of the afterglow time of the fluoride complex red phosphor,
the lighting controller controls each light source of the plurality of light sources to:
maintain the each light source in a turn-off period until a start of a hold period during which the second alignment state of the liquid crystal molecules is held while a pixel group of the plurality of pixel groups corresponding to the each light source is driven by the panel controller; and
make a shift to a turn-on period of the each light source after a predetermined period of time has elapsed since the start of the hold period.

15. The display device according to claim 1, wherein
the content ratio of the complex fluoride red phosphor is 85%, and
the content ratio of the nitride red phosphor is 15%.

16. The display device according to claim 1, wherein
the content ratio of the complex fluoride red phosphor is 75%, and
the content ratio of the nitride red phosphor is 25%.

17. A head-mount display comprising:
the display device according to claim 14;
a lens through which an image of a displayed image on the display device is formed in an eye of a user; and
a head mounter to be mounted on a head of the user, the head mounter including the display device and the lens.

* * * * *